sensor compresses a flat, multi-turn coil of fine
United States Patent [19]

Calfo et al.

[11] 4,230,961
[45] Oct. 28, 1980

[54] MAGNETIC FLUX SENSOR FOR LAMINATED CORES

[75] Inventors: Raymond M. Calfo, Pittsburgh; Arthur Mulach, Penn Hills, both of Pa.

[73] Assignee: Westinghouse Electric Corp., Pittsburgh, Pa.

[21] Appl. No.: 941,616

[22] Filed: Sep. 12, 1978

[51] Int. Cl.³ .......................................... H02K 11/00
[52] U.S. Cl. ................................ 310/68 R; 310/68 C; 310/256; 310/72; 361/25; 324/51; 324/158 MG
[58] Field of Search ................. 310/68 C, 68 R, 65, 310/256, 260, 270, 72, 194; 361/25; 324/51, 158 MG

[56] References Cited

U.S. PATENT DOCUMENTS

| | | | |
|---|---|---|---|
| 2,088,949 | 8/1937 | Fekete | 310/68 R |
| 2,328,470 | 8/1943 | Lange et al. | 310/194 |
| 3,131,322 | 4/1964 | Pleiss, Jr. et al. | 310/68 R |
| 3,506,914 | 4/1970 | Albright et al. | 324/51 |
| 3,624,504 | 11/1971 | Joly | 324/158 MG |
| 3,842,297 | 10/1974 | Pleiss, Jr. et al. | 310/68 C |
| 3,855,529 | 12/1974 | Langweiler | 324/158 MG |
| 4,140,933 | 2/1979 | Wambsgauss et al. | 310/68 R |

FOREIGN PATENT DOCUMENTS 2655464  6/1977  Fed. Rep. of Germany ... 324/158 MG

Primary Examiner—Donovan F. Duggan
Attorney, Agent, or Firm—G. H. Telfer

[57] ABSTRACT

A flux sensor is provided for measuring magnetic flux in laminated cores, and especially for measuring the axial flux in the end regions of the stator cores of large generators. The sensor comprises a flat, multi-turn coil of fine wire enclosed in an insulating enclosure which includes a pressure-supporting member of greater thickness than the coil. The sensor is thin enough to be placed between the laminations of a generator core and the high clamping pressure is carried by the pressure-supporting member which protects the coil. The leads are flat conductors brought out between the laminations to the periphery of the core. Such a sensor can remain permanently embedded in the core since it does not effect the core structure.

4 Claims, 5 Drawing Figures

MAGNETIC FLUX SENSOR FOR LAMINATED CORES

BACKGROUND OF THE INVENTION

The present invention relates to the measurement of magnetic flux in laminated cores, and more particularly to a flux sensing means which can be built into a laminated core such as the stator core of a large turbine generator to determine the magnetic flux in regions of the core not otherwise accessible.

In large synchronous dynamoelectric machines, the currents in the end turn portions of the rotor winding and in the end portions of the stator windings have magnetic fields which combine to produce an axially-directed magnetic flux. This axial flux enters the end of the stator core in a direction generally perpendicular to the core laminations, and causes relatively large eddy currents in the end regions of the core. The corresponding losses can be quite high and often result in excessive heating in the end regions of the core. As the maximum ratings of large turbine generators have increased, this has become an increasingly severe problem because of the high iron temperature in the end regions of the core, particularly in the tooth areas, and has sometimes resulted in undesirable limitations on the ratings of large machines. Calculation or prediction of the localized temperatures in the end portion of the stator core is a very complex problem because the axial flux interacts with the armature leakage flux from the stator coils, as well as with the radial airgap flux, resulting in high saturation levels in the stator tooth region. The interaction of these various fluxes at any particular point and time depends on their relative magnitudes and phase relations, which are time varying and difficult to determine with any accuracy. The temperature profile axially of the stator core is dependent on the axial penetration depth of the axial flux, as well as on the relationship between the localized loss and the axial component of the flux at each point. All these varying and complex factors make it extremely difficult to predict the temperature rise in the end region of the stator core of a large generator. It is highly desirable, therefore, to make accurate measurements of the flux actually existing at particular points in the core, so that the magnitude and distribution of the axial flux can be determined. It has not been possible heretofore, however, to make such measurements because there is no way in which conventional search coils could be inserted into a laminated stator core at the desired locations without the coils being destroyed by the heavy pressure under which the core laminations are clamped, and without affecting or disrupting the structural integrity of the stator core itself.

SUMMARY OF THE INVENTION

The present invention provides means for measuring the magnetic flux at any desired location within a laminated magnetic core such as the stator core of a large generator.

In accordance with the invention, a flux sensor is provided which can be embedded in a laminated core and is not adversely affected by the high clamping pressure between the core laminations while it does not affect the structural integrity of the core, so that it can be built into the core and allowed to remain in place therein. The sensor consists of a flat, multi-turn coil of fine wire which is enclosed in, or surrounded by, a pressure-supporting element which protects the coil from the high pressure existing between laminations of a stator core. The pressure-supporting element may consist of an insulating element of greater thickness than the coil and sufficiently incompressible or pressure-resistant to remain thicker than the coil even under the maximum pressure to which it is subjected. The entire assembly is enclosed in insulating material such as glass tape and the coil leads are joined to flat ribbon conductors. The sensor is very thin and can be placed between laminations at any desired location in the core, the flat conductors extending between the laminations to the outer periphery of the core.

BRIEF DESCRIPTION OF THE DRAWINGS

The invention will be more fully understood from the following detailed description, taken in connection with the accompanying drawings, in which.

DESCRIPTION OF THE PREFERRED EMBODIMENT

Figure 1:
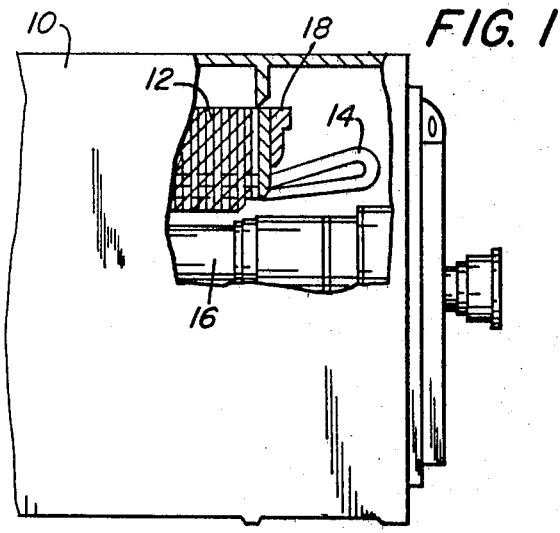
FIG. 1 is a view, in elevation, of a large generator with part of the housing broken away.

As previously indicated, the flux sensor of the present invention is particularly useful in the stator cores of large turbine generators. FIG. 1 shows a typical construction for such a machine including a gas-tight housing 10 with a laminated stator core 12 supported in the housing. The core 12 carries stator windings 14 of any suitable type disposed in longitudinal slots in the core, and a rotor 16 is supported in bearings in the housing 10 and carries the usual field winding. The machine is cooled by circulation of a coolant gas, usually hydrogen, which is contained in the housing 10 and circulated through the machine in any desired manner. The core 12 is built up in the usual way of laminations or punchings 17 which are clamped axially by suitable clamping means generally indicated at 18. The clamping pressure may be quite high, such as about 200 pounds per square inch, for example.

Figure 2:
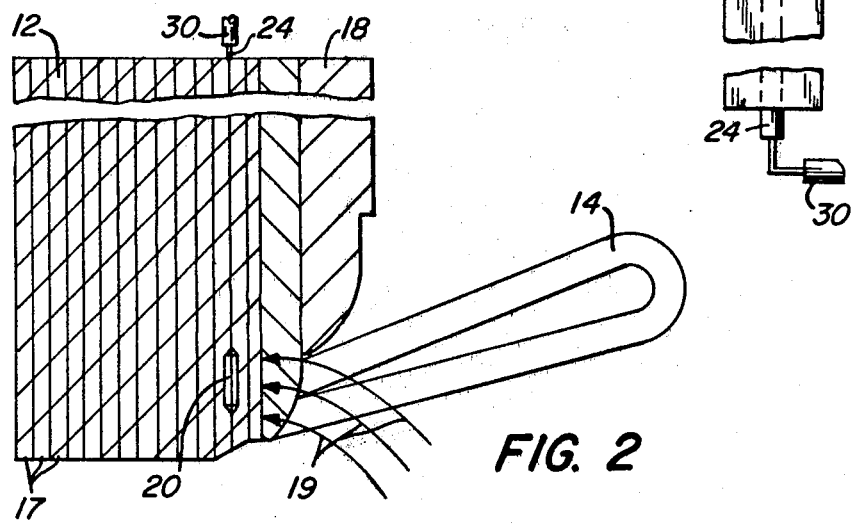
FIG. 2 is an enlarged fragmentary view of a portion of the end of a generator stator core.

As discussed above, the currents in the end turn portions of the stator winding 14 and the field current in the end portions of the rotor winding have magnetic fields which combine to produce a magnetic flux as indicated by the arrows 19 in FIG. 2. This flux is generally axial in direction and penetrates for a substantial distance into the end region of the stator core 12 in a direction substantially perpendicular to the plane of the laminations. This axial flux, therefore, causes substantial eddy current losses in the end region of the core with resultant heating which in some cases may become excessive. The stator currents are, of course, alternating currents while the field current is a direct current which reverses in polarity, with respect to any point on the stator, as the rotor rotates. The pulsating magnetic flux resulting from the combination of these currents, therefore, varies as the magnitudes and the phase relations of the stator current and the field current change. The magnitude and distribution of these axial fluxes, therefore, are very difficult to analyze and predict, because of these varying relations and also because the axial flux interacts with the armature leakage flux in the core due to the stator currents as well as with the radial air gap flux produced by the rotor winding. The losses due to the axial flux are superimposed on the normal core loss and can become quite high, particularly in the tooth region of the core. The excessive temperature rise due to the axial flux has thus become a serious problem as machine ratings have increased, and actual measurement of these fluxes has become very desirable, because of the difficulty of accurately calculating their magnitude and distribution. It has not been possible heretofore, however, to actually measure these fluxes in the locations where the excessive losses occur, since there has been no way to measure the flux in the interior of the core itself. The present invention provides a flux sensor 20 which can be embedded in the core 12 at any location where a measurement of the flux is desired.

Figure 3:
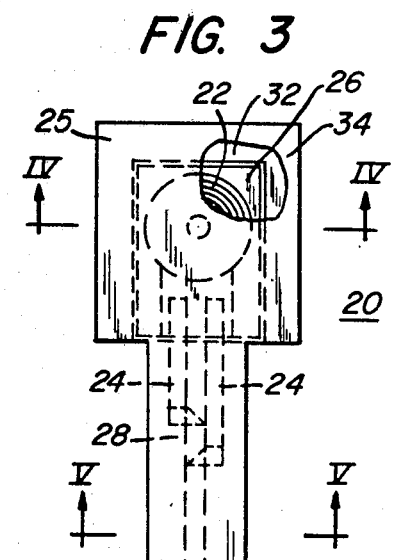
FIG. 3 is a view, in elevation, partly broken away, of a flux sensor embodying the invention.
Figure 4:
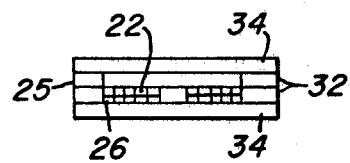
FIG. 4 is a sectional view on the line IV—IV of FIG. 3.
Figure 5:
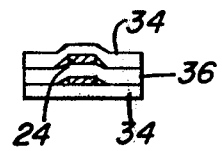
FIG. 5 is a sectional view on the line V—V of FIG. 3.

As shown in FIGS. 3, 4 and 5, the flux sensor 20 utilizes as the sensing element a spiral coil 22 of fine copper wire. The coil 22 is a flat, multi-turn coil and is shown as a single layer coil, in the preferred embodiment, utilizing a sufficient number of turns to generate a voltage of the necessary magnitude for accurate measurement. In a typical embodiment of the invention, for example, the coil 22 may consist of one hundred turns of 0.002 inch copper wire. The ends of the coil 22 are attached to flat leads 24 which, in the illustrative embodiment, may be copper ribbon conductors, 0.125 by 0.005 inch in cross section, spot-welded or otherwise attached to the ends of the coil. The coil 22 is enclosed in insulation and protected against the high clamping pressure existing in the generator core in which it is to be used. For this purpose, a pressure-supporting enclosure 25 is provided which may be made of any suitable insulating material capable of withstanding the clamping pressure between the core laminations, thin glass tape being the preferred material.

The enclosure 25 should be sufficiently pressure-resistant to absorb the clamping pressure to which it will be subjected, and is preferably substantially incompressible in the sense that when subjected to the maximum pressure in the core, it will not be compressed or deflected sufficiently to reduce its thickness enough to subject the coil 22 itself to the high pressure. In the illustrative embodiment, the coil 22 is encased in a rectangular insulating encasement 26 which may be made of a suitable plastic, for example. The encasement 26 has an opening or openings at one side of sufficient size for the leads 24 to extend outwardly from the coil. The flat leads 24 are brought out side-by-side from the coil 22 and folded, as indicated at 28, to bring them into alignment in such a manner that one lead overlies the other, as can be seen in FIG. 5. The leads 24 are made long enough to extend between the laminations of the stator core to the outer periphery of the core and may be connected to an external cable 30 for connection to a measuring circuit or other external circuit.

The pressure-supporting enclosure 25 is built up of layers of glass tape. Thus, as can be seen in FIGS. 3 and 4, two U-shaped pieces of thin glass tape 32 are placed around the rectangular coil encasement 26. Two long pieces of tape 34 having enlarged end portions coextensive with the pieces 32 are placed on the top and bottom of the assembly and extend for the full length of the leads 24. A strip of tape 36 is placed between the two leads 24 to insulate them from each other. In the illustrative embodiment mentioned above, the insulating layers 32, 34 and 36 are made of 0.011 inch thick glass tape, assembled as shown, and the complete assembly is then compressed to a maximum thickness of 0.032 inch. When the assembly is subjected to high pressure, the pressure is resisted and absorbed by the glass tape enclosure. The tape pieces 32 initially have a greater total thickness than the coil 22, and even when compressed under high pressure, their thickness remains greater so that they support the pressure and protect the coil.

Since the sensor 20 is extremely thin, it can be placed between two adjacent laminations 17 during construction of the core 12 in the exact location where it is desired to measure the axial flux. When the core is completed and clamping pressure is applied, with the sensor 20 in place, the usual high clamping pressure, which may be of the order of 200 pounds per square inch, does not damage or affect the sensor since the enclosure 25 is capable of supporting the pressure and protects the coil 22 which is thus not subjected to any significant pressure. The thin ribbon conductors which constitute the leads 24 are not affected by pressure and extend out radially between the laminations to the other periphery of the core, where they can be connected by a cable 30 or other means to an external circuit for measuring the voltage induced in the coil 22 by the axial flux. The flat ribbon conductors 24 are arranged as shown, with one conductor overlying the other, to prevent any axial flux from being linked or enclosed by the leads, so that no errors are introduced into the reading by voltages induced in the leads.

It will now be apparent that a magnetic flux sensor has been provided which can be embedded in a laminated magnetic core to measure the flux at a desired point in the core and which can be left permanently in position. The rugged construction of the sensor enables it to withstand the pressures to which it is subjected, as explained above, and the materials used are capable of withstanding the temperatures normally occurring in the core. It can, therefore, be left in position permanently. The sensor is intended primarily for measuring the axial flux during initial testing and operation of a machine, to verify design calculations or to provide design data for future machines, but it can be used at any time during the life of the machine if measurements of the axial flux are desired. The flat configuration and small axial dimension of the sensor are such that it is, in effect, absorbed in the stator core and does not affect the physical integrity or structure of the core itself. Even if the coil 22 should become accidentally shorted, for any reason, the current that might then occur would be very small and would have negligible effect since only a small fraction of a degree temperature rise of the core could result. Thus, the presence of the sensor 20 during operation of the machine has no material effect. The use of this sensor has been discussed primarily with respect to its use in the stator cores of large generators, but it will be apparent that its usefulness is not necessarily so limited, and it can be utilized to measure fluxes in laminated magnetic cores of any type, such as transformer cores, for example, or for measuring magnetic fluxes or other quantities in any location where its small size and ability to withstand pressure are desirable.

What is claimed is:

1. In combination: a magnetic core comprising a plurality of laminations clamped together under pressure;
   flux sensing means embedded in said core, said sensing means comprising a flat, multi-turn coil located between two adjacent ones of said plurality of laminations and parallel to the plane of said laminations proximate the end region of the core in a position to sense axial magnetic flux, said coil having no magnetic material extending through the turns thereof, said coil having flat conductive leads extending therefrom and between said two adjacent laminations to the exterior of said magnetic core;

means for insulatively enclosing said coil and for supporting the pressure contact of said adjacent laminations, said means having a total thickness greater than that of said coil.

2. The combination of claim 1 in which the pressure-supporting means comprises generally U-shaped elements of glass tape stacked to thickness greater than that of said coil.

3. The combination of claim 1 in which said leads are flat conductors and are disposed with one lead overlying the other and insulated therefrom.

4. The combination of claim 1 in which said magnetic core is the stator core of a dynamoelectric machine, and said sensing means is embedded in the end region of the core in position to sense axial magnetic flux.

* * * * *